US009641070B2

(12) United States Patent
Wibben

(10) Patent No.: US 9,641,070 B2
(45) Date of Patent: May 2, 2017

(54) CIRCUITS AND TECHNIQUES FOR DETECTING AN OPEN PIN CONDITION OF AN INTEGRATED CIRCUIT

(71) Applicant: Allegro Microsystems, LLC, Worcester, MA (US)

(72) Inventor: Joshua Wibben, New Brighton, MN (US)

(73) Assignee: Allegro Microsystems, LLC, Worcester, MA (US)

( * ) Notice: Subject to any disclaimer, the term of this patent is extended or adjusted under 35 U.S.C. 154(b) by 315 days.

(21) Appl. No.: 14/301,487

(22) Filed: Jun. 11, 2014

(65) Prior Publication Data

US 2015/0362550 A1  Dec. 17, 2015

(51) Int. Cl.
*G01R 31/02* (2006.01)
*H02M 3/156* (2006.01)
(Continued)

(52) U.S. Cl.
CPC .......... *H02M 3/156* (2013.01); *G01R 31/025* (2013.01); *G01R 31/2853* (2013.01);
(Continued)

(58) Field of Classification Search
CPC .. G01R 31/025; G01R 31/26; G01R 31/2642; G01R 31/265; G01R 31/2853;
(Continued)

(56) References Cited

U.S. PATENT DOCUMENTS 4,528,458 A   7/1985 Nelson et al.
4,599,576 A   7/1986 Yoshida et al.
(Continued)

FOREIGN PATENT DOCUMENTS

WO    WO 98/55880      12/1998
WO    WO 2013/142015    9/2013

OTHER PUBLICATIONS

Allegro Data Sheet: A8580 "Wide Input Voltage, 2.4MHz, 2.5 A Asynchronous Buck Regulator with Low-IQ Standby, Sleep Mode, External Synchronization, and NPOR Output," Allegro MicroSystems, LLC, Jan. 20, 2014, 40 pages.
(Continued)

*Primary Examiner* — Hoai-An D Nguyen
(74) *Attorney, Agent, or Firm* — Daly, Crowley, Mofford & Durkee, LLP

(57) ABSTRACT

An integrated circuit an open pin detector includes a current source coupled to the pin, a comparator having a first input coupled to the pin, a second input responsive to a threshold voltage, and an output at which a comparator output signal is provided. A controller is responsive to the comparator output signal to provide an enable signal to the current source and an open pin signal indicative of an open pin condition at the pin. A method for detecting an open pin condition of a pin of an integrated circuit includes comparing the pin voltage to a first threshold voltage level, initiating open pin detection in response to the pin voltage falling below the first threshold voltage level, such as by providing a current to the pin, and indicating an open pin condition if the pin voltage rises to exceed a second threshold voltage level within a predetermined time interval. Also described is preventing the pin voltage from exceeding a predetermined voltage level during open pin detection.

19 Claims, 4 Drawing Sheets

(51) Int. Cl.
*G01R 31/28* (2006.01)
*G01R 31/40* (2014.01)
*H02M 1/32* (2007.01)
*H02M 1/00* (2006.01)

(52) U.S. Cl.
CPC .............. *G01R 31/40* (2013.01); *H02M 1/32* (2013.01); *H02M 2001/0025* (2013.01)

(58) Field of Classification Search
CPC ............ G01R 31/2884; G01R 31/3012; G01R 31/31702; G01R 31/318511; G01R 1/0491; G01R 31/40; H02M 3/156; H02M 1/32; H02M 2001/0025
USPC ......... 324/762.01, 762.02, 762.03, 500, 503, 324/537
See application file for complete search history.

(56) References Cited

U.S. PATENT DOCUMENTS

| | | | |
|---|---|---|---|
| 5,414,715 A | 5/1995 | Hamblin et al. | |
| 5,536,934 A * | 7/1996 | Hayashi | H01S 5/06825 250/214.1 |
| 5,880,620 A | 3/1999 | Gitlin et al. | |
| 6,396,315 B1 | 5/2002 | Morris | |
| 6,520,615 B1 | 2/2003 | Beck et al. | |
| 6,559,721 B2 | 5/2003 | Ausserlechner et al. | |
| 6,630,844 B1 | 10/2003 | Chong et al. | |
| 7,054,123 B2 | 5/2006 | Ausserlechner et al. | |
| 8,331,072 B1 | 12/2012 | Liu et al. | |
| 2002/0121917 A1* | 9/2002 | Murakawa | G09G 3/006 324/760.01 |
| 2004/0100299 A1* | 5/2004 | Murakawa | G09G 3/006 324/762.09 |
| 2004/0232919 A1 | 11/2004 | Lacey | |
| 2006/0284655 A1 | 12/2006 | Li et al. | |
| 2009/0033383 A1 | 2/2009 | Wyatt et al. | |
| 2009/0087722 A1* | 4/2009 | Sakabe | B60L 3/0046 429/61 |
| 2009/0091332 A1* | 4/2009 | Emori | B60L 11/1855 324/537 |
| 2009/0198399 A1* | 8/2009 | Kubo | B60L 11/1855 701/22 |
| 2010/0207639 A1 | 8/2010 | Yamawaki | |
| 2010/0271054 A1* | 10/2010 | Nagasawa | G01R 31/2853 324/705 |
| 2011/0234255 A1 | 9/2011 | Chobot | |
| 2012/0081128 A1 | 4/2012 | Laber et al. | |
| 2012/0139524 A1* | 6/2012 | Suzuki | G05F 1/561 323/315 |
| 2012/0155285 A1 | 6/2012 | Smart et al. | |
| 2012/0194201 A1 | 8/2012 | Saloio | |
| 2013/0026994 A1* | 1/2013 | Morikawa | G01R 31/3658 320/134 |
| 2013/0242447 A1 | 9/2013 | Pirchio et al. | |
| 2014/0208279 A1* | 7/2014 | Bhawmik | G01R 31/2853 716/106 |

OTHER PUBLICATIONS

Response to Written Opinion filed May 14, 2015 for European Application No. 13707796.2; 22 pages.
Response to Office Action dated Jun. 19, 2014 as filed on Sep. 16, 2014 for U.S. Appl. No. 13/423,891, filed Mar. 19, 2012.
PCT International Preliminary Report on Patentability for PCT/US2013/027886 dated Oct. 2, 2014.
Notice of Allowance for U.S. Appl. No. 14/423,891, filed Mar. 19, 2012.
Notice of Non Final Office Acton dated Jun. 19, 2014, U.S. Appl. No. 13/423,981, 21 pages.
PCT International Search Report and Written Opinion Dated Jun. 13, 2013, Pat App. No. PCT/US2013/027886, 9 pages.
Melexis, Microelectronic Integrated Systems; ""Under-the-Hood" Triaxis Rotary Position;" MLX94324; Dec. 2008; 40 pages.

* cited by examiner

CIRCUITS AND TECHNIQUES FOR DETECTING AN OPEN PIN CONDITION OF AN INTEGRATED CIRCUIT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuits and, more particularly, circuits and techniques for detecting an open pin condition of an integrated circuit.

BACKGROUND OF THE INVENTION

Integrated circuits (ICs) require reliable interconnections for proper operation. Illustrative integrated circuits include digital ICs, analog ICs, and mixed signal ICs.

Regulators, or converters, including a switch for transferring energy from an input, such as an AC or DC voltage or current source, to a regulated output are well known. In some regulators, sometimes referred to as switching regulators, the switch turns on and off to regulate the output. Common switching regulator configurations include Buck, Boost, Buck-Boost, flyback, SEPIC, Cúk, half bridge, and full bridge to name a few. Such switching regulators include an inductor to convert the switched current pulses into a continuous load current. In other regulators, sometimes referred to as linear regulators, the switch operates in its active, or saturation region.

Regulators often require the regulated output to be coupled to a switch control circuit in a feedback relationship (i.e., to a feedback input of the control circuit) for use in controlling the switch(es) that transfer energy from the input to the output. If this feedback connection from the regulated output to the switch control circuit were to become disconnected (i.e., referred to herein as an "open pin condition"), then the integrated circuit may increase the output to the load, providing a damaging voltage or current to the load. One technique for detecting such an open pin condition is to introduce a relatively small current into the feedback input of the regulator which, in the presence of an open pin condition, would increase the feedback voltage to a level that would cause the control loop to drive the output voltage low and possibly trip an overvoltage protection circuit.

SUMMARY OF THE INVENTION

In one aspect of the invention, an integrated circuit open pin detector includes a current source coupled to a pin of the integrated circuit, a comparator having a first input coupled to fee pin, a second input responsive to a threshold voltage, and an output at which a comparator output signal is provided, and a controller responsive to the comparator output signal and configured to provide an enable signal to the current source and an open pin signal indicative of an open condition at the pin.

Features may include one or more of the following. The threshold voltage may be at a first voltage level or a second voltage level in response to the enable signal. The open pin detector may further include a current sink coupled to the pin. The integrated circuit may be a switching regulator control circuit, the switch may be turned off in response to the open pin signal, and/or a regulated output voltage of the regulator may be coupled to the pin. The controller may include a state machine. A clamp, as may take the form of a poll down resistor, may be coupled to the pin to prevent a voltage at the pin from exceeding a predetermined level.

According to a further aspect, a method for detecting an open pin condition of an integrated circuit pin includes comparing a voltage at the pin to a first threshold voltage, initiating an open pin detection in response to the voltage at the pin falling below the first threshold voltage, and indicating an open pin condition if the voltage at the pin rises to exceed a second threshold voltage within a predetermined time interval.

The method may fusilier include re-initiating the open pin detection after an open pin condition is indicated. Initiating the open pin detection may include sourcing a current into the pin and/or changing the threshold voltage at a comparator input from the first threshold voltage to the second threshold voltage. The predetermined time interval may be a predetermined number of clock cycles. For example, the integrated circuit may be a switching regulator control circuit and a regulated output voltage of the switching regulator coupled to the pin and the predetermined number of clock cycles may be one or more switching clock cycles. The method may further include preventing the voltage at the pin from exceeding a predetermined level. For example, the predetermined level may be selected based on a VOUT bias enable threshold level. The method may further include sinking a current from the pin.

Also described is a method for detecting an open pin condition of an integrated circuit pin including providing a current to the pin, determining if a voltage at the pin changes by a predetermined amount within a predetermined time interval, and preventing the pin voltage from exceeding a predetermined voltage level. Determining if the pin voltage changes by the predetermined amount may include comparing the pin voltage to a first threshold level at a beginning of the predetermined time interval and to a second threshold level at an end of the predetermined time interval. In one embodiment, the integrated circuit is a switching regulator control circuit and the predetermined voltage level is selected based on a VOUT bias enable threshold level.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
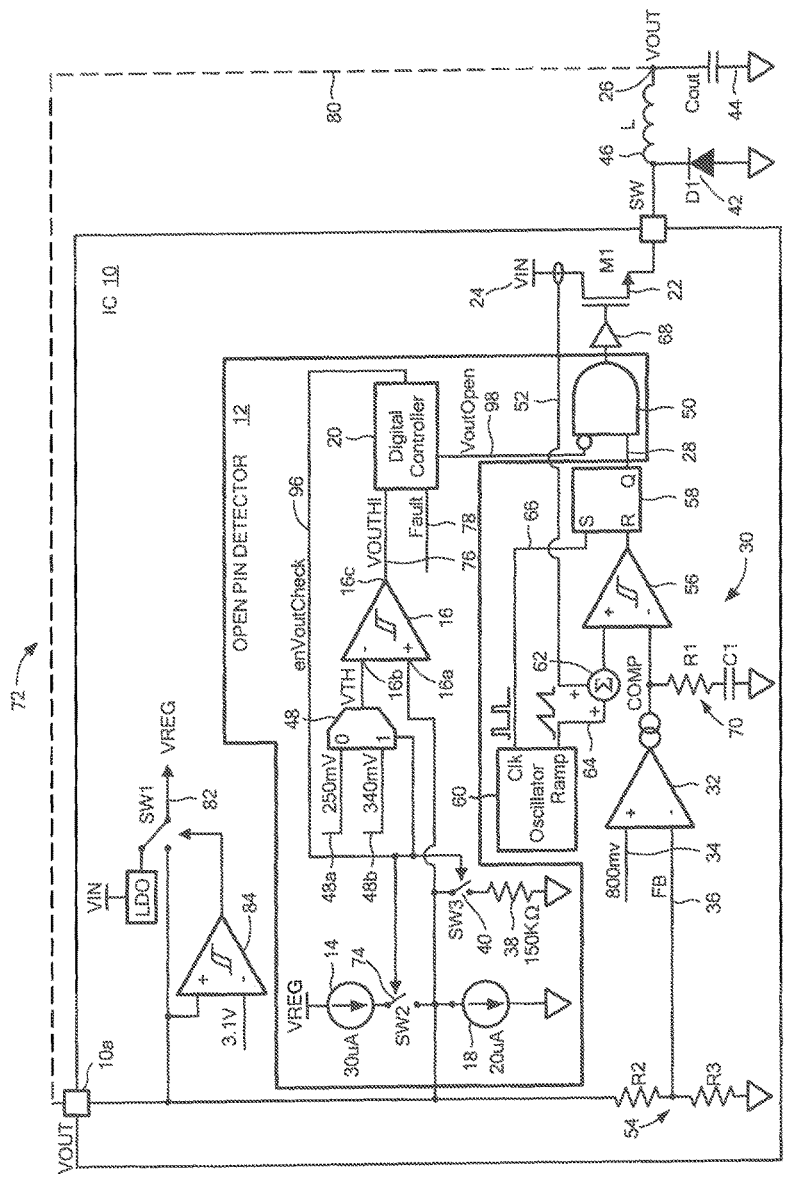
FIG. 1 is a block diagram of an integrated circuit for controlling a regulator and including an open pin detector.

Referring to FIG. 1, an integrated circuit 10 includes an open pin detector 12 for detecting an open pin condition at a pin 10a. The open pin detector 12 includes a current source 14 coupled to the pin 10a, a comparator 16 having a first input 16a coupled to the pin, a second input 16b responsive to a threshold voltage $V_{TH}$, and an output 16c at which a comparator output signal VOUTHI 76 is provided, and a controller 20 responsive to the comparator output signal VOUTHI and configured to provide an enable signal enVoutChk 96 to the current source 14 and an open pin signal voutOpen 98 indicative of an open condition, at the pin 10a. With this arrangement, an open pin condition at the pin 10a can be detected by comparing a voltage at the pin 10a (herein, the pin voltage) to a first threshold voltage, initiating an open pin detection in response to the pin voltage falling below the first threshold voltage (I.e., under the control of the enable signal enVoutChk) and indicating an open pin condition (i.e., with the open pin signal voutOpen) if the pin voltage rises to exceed a second threshold voltage within a predetermined time interval.

Also described is a method for detecting an open pin condition on the pin 10a by providing a current to the pin, determining if the pin voltage changes by a predetermined amount within a predetermined time interval, and preventing the pin voltage from exceeding a predetermined voltage level, as will be described.

The open pin detector 12 former includes a current sink 18, a multiplexer 48, and a switch 74 coupled between the current source 14 and the pin 10a. The multiplexer 48 has two inputs, each receiving a different threshold voltage. In the illustrative embodiment, a first threshold voltage 48a is provided at a level on the order of 250 mv and a second threshold voltage 48b is provided at a level on the order of 340 mv.

A pull down resistor 38 of the open pin detector 12 is selectively coupled to the IC pin 10a through a switch 40. The pull down resistor 38 prevents the voltage at the IC pin 10a from exceeding a predetermined voltage level during open pin detection. The predetermined voltage level may be selected based on various factors or specifications. As an example, the predetermined voltage level may be based on a VOUT bias enable threshold voltage level (e.g., 3.1V) of a VREG voltage comparator 84, as will be explained. The voltage at IC pin 10a may also be held below a predetermined voltage with a diode, closed loop method, or any other method that will limit the voltage, but still allow the pin to slew daring open pin detection.

The controller 20 may be a digital controller as may include a state machine and is responsive to the comparator output signal VOUTHI 76 and a Fault signal 78 and generates the open pin signal voutOpen 98 and the enable signal enVoutChk 96. In the illustrative embodiment, the Fault signal 78 is a collection of fault signals as may be assembled together with an OR gate (not shown). Illustrative faults include, without limitation, a power on reset (POR) fault, an undervoltage lockout fault (UVLO), and a thermal shutdown (TSD) fault. The operation of the controller 20 is described below in conjunction with FIGS. 2 and 3.

The integrated circuit 10 can be any type of integrated circuit that would benefit from monitoring one or more pins for an open pin condition. In the illustrative embodiment, the integrated circuit 10 is a switching regulator control circuit that controls the regulator 72 including a switch 22 that conducts to transfer energy from an input source VIN, 24 to an output of the regulator 72 at which a regulated output VOUT 26 is provided. A switch control circuit 30 generates a switch control signal 28 to control conduction of the switch 22.

In embodiments in which the integrated circuit 10 is a regulator control circuit, the regulator 72 may be a switching regulator, such as the type shown in FIG. 1, or a linear regulator. Furthermore, the regulator 72 may be an AC to DC regulator in which the input source 24 is an AC voltage or current source, a DC to DC regulator in which the Input source 24 is a DC voltage or current source, a current regulator providing a regulated current at the output 26, or a voltage regulator providing a regulated voltage at the output 26, as examples. The illustrated embodiment is a DC to DC switching voltage regulator 72 that provides a regulated output voltage VOUT 26.

The regulator 72 includes, in addition to the regulator control IC 10, a diode 42, an output capacitor 44 across which the regulated output voltage VOUT 26 is provided, and an inductor 46 coupled between the switch 22 and the regulator output 26. The illustrative regulator 72 is a Buck regulator and the switch 22 is here shown to be a Metal Oxide Field Effect Transistor (MOSFET); however, it will be appreciated by those of ordinary skill in the art that the regulator may be configured in various topologies and the switch, which can include more than one switch, can take various forms.

The switch 22 conducts at a duty cycle $D_T$ established by the switch control signal 28 coupled to a control terminal of the switch, here a gate terminal of the FET, so as to maintain the output voltage 26 to within a specified voltage range, referred to alternatively as the regulation range. As will be described below, here, the switch control signal 28 is gated by the open pin signal voutOpen 98 via an AND gate 50.

Various control schemes can be used to establish the switch control signal 28, such as voltage mode or current mode. In the illustrative embodiment a resistor divider 54 that is adapted to be coupled to the regulator output 26 is used to establish a feedback signal FB, 36 that is proportional to the output voltage VOUT and is coupled to the switch control circuit 30.

The switch control circuit 30 includes an error amplifier 32 having an inverting input coupled to the feedback signal 36, a non-inverting input that receives a reference signal 34, and an output at which a COMP signal is provided. The error amplifier 32 provides a current that charges a capacitor in a series-coupled resistor capacitor arrangement 70 to provide a COMP signal, as shown. The output voltage 26 operates at a regulation point within the regulation range when the COMP voltage remains at a relativity static voltage due to the error between reference signal 34 and feedback signal 36 being minimized.

The COMP signal governs the switch operation to control the peak current in the inductor 46 using the current mode control loop consisting of current comparator 56, SR latch 58, and oscillator 60. The switch control circuit 30 may further include slope compensation circuitry, here in the form of a summing element 62 that combines a ramp signal 64 provided by the oscillator 60 with a current signal 52 indicative of the input current from the input source 24. The switch control circuit may also be realized with voltage mode control in which case the current comparator 56, SR latch 58, and oscillator 60 would be replaced with a voltage to duty cycle circuit which is generally realized with a fixed frequency voltage ramp oscillator replacing oscillator 60 connected to a duty cycle comparator coupled to the COM signal.

In general, a clock signal 66 from the oscillator 60 sets the latch 58 and the output of the current comparator 56 resets the latch. Given the buffer 68, that acts as a gate driver, and NMOS switch 22, setting the latch 58 corresponds to turning on the switch 22 and resetting the latch corresponds to turning off the switch 22.

During operation, the switch duty cycle is controlled by the current comparator 56 which resets the SR latch 58 when the inductor current crosses the level set by error amplifier 32. This arrangement results in COMP signal being proportional to the load current, which in turn results in regulation of the output 26 over load variations and transients.

The regulator control circuitry is provided on the integrated circuit 10 that includes various pins, such as the SW pin at the source of the switch 22 and the VOUT pin 10a which is adapted to receive the regulator output voltage 26, as shown. In the illustrative embodiment, the inductor 46, diode 42, and capacitor 44 are not on the integrated circuit 10 and the dotted line 80 illustrates the coupling of the regulated output voltage 26 to the VOUT pin 10a.

The VOUT pin 10a is coupled to the resistor divider 54 and also to a VREG node 82 through a switch SW1. A comparator 84 compares the output voltage 26 to a reference voltage that is less than the regulation point, such as the illustrated 3.1V, to provide a control signal to the switch SW1. The VREG voltage is used to power various circuitry on the integrated circuit 10, and is biased to VOUT to provide higher efficiency with the buck regulator 72 than the linear regulator (LDO) can provide. During startup VOUT is too low to power the internal circuitry, therefore the linear regulator LDO and comparator 84 are introduced to power the internal circuitry off of the linear regulator LDO until VOUT reaches a voltage sufficient to power the internal circuitry (e.g., 3.1V). The threshold at which the VREG voltage supply is changed from the linear regulator LDO to the VOUT pin 10a (here, the threshold voltage provided to the comparator 84) is referred to as the VOUT bias enable threshold (e.g., 3.1V).

When a failure occurs whereby the connection 80 from the regulator output 26 to the VOUT pin 10a is interrupted or broken, the FB signal voltage 36 will be pulled to ground by resistor R3 and therefore can cause the regulated output 26 to rise to a level that causes damage to the regulator load and/or to the regulator control IC 10.

Figure 2:
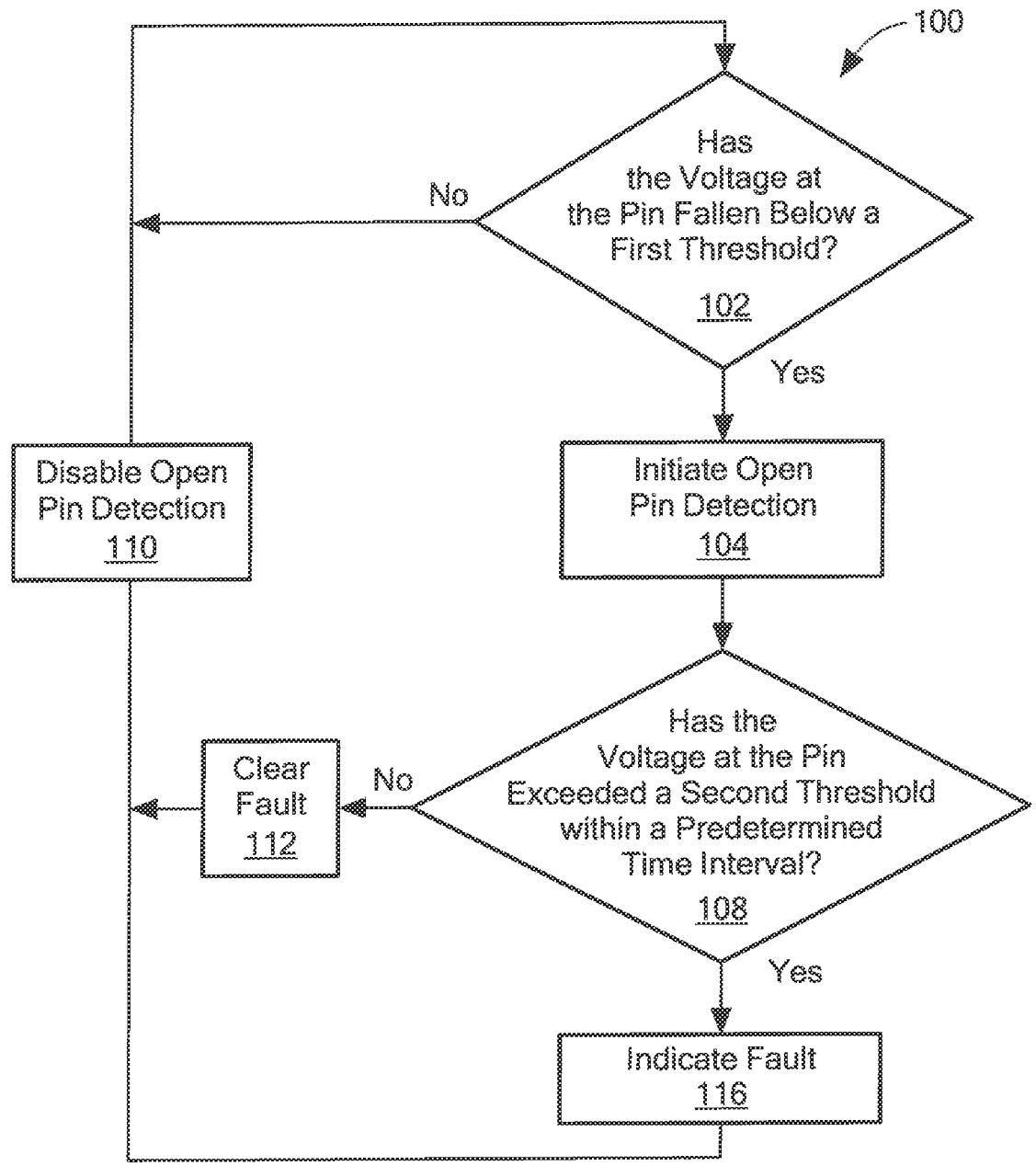
FIG. 2 is a simplified flow diagram illustrating operation of the open pin detector of FIG. 1.

Referring also to FIG. 2, a simplified flow diagram shows an illustrative method 100 for detecting an open pin condition which commences by determining, at decision block 102, whether the voltage at the pin 10a has fallen below a first threshold level. Here, this determination is made by comparing the pin voltage at the input 16a of comparator 16 to the first threshold voltage 48a, here of 250 mv. If the pin voltage has fallen below the first threshold voltage, then the open pin detection is commenced in block 104. In the illustrative embodiment, commencing the open pin detection occurs under the control of the controller 20 which responds to the comparator output signal VOUTHI going low to assert the enable signal enVoutChk. Alternatively, if the pin voltage has not fallen below the first threshold voltage, then block 102 is repeated until this condition occurs.

Assertion of the enable signal enVoutChk 96 initiates the open pin detection in step 104 by closing switch 74 to cause the current source 14 to source current to the pin 10a, closing switch 40 to couple the pull down resistor 38 to the pin, and toggling the multiplexer 48 so that the second threshold voltage 48b (e.g., 340 mv) is coupled to the comparator input 16b. With this configuration, it is determined in block 108 whether the pin voltage has exceeded the second threshold level 48b within a predetermined time interval. The current source 14 is sized to ensure that if the pin 10a is open, then this current will cause the pin voltage to increase quickly after the switch 74 is closed; whereas if the pin is not open, the pin voltage will not increase to the second threshold level within the predetermined time interval. In the illustrative embodiment, the current source 14 is on the order of 30 microamps and the predetermined time interval is established by the oscillator 60; for example, the predetermined time interval may be on the order of one cycle of a clock signal 66 having a frequency between approximately 100 KHz to 2 MHz.

The current sink 18 is always on (regardless of whether open pin detection is enabled or not) in order to ensure that if there is an open pin condition, the VOUT voltage 26 does not ratchet up. Without the presence of a sink current 18, when the source current 14 is disabled the pin voltage could remain unchanged, thus each time the source current 14 is enabled the pin voltage would be charged up further than the last cycle, resulting in the pin voltage ratcheting up. Therefore the sink current 18 is designed to discharge the pin voltage to a level at or below the level it started at before the current source 14 was enabled. The magnitude of the current source 14 (with the constant current sink 18 accounted for) is selected such that when the VOUT pin 10a is connected to the external output capacitor 44, the pin voltage will not rise up from the first threshold 48a to the second threshold 48b in a predetermined time (e.g., one clock cycle). With this arrangement, the current source 14 is sized so that an open pin condition can be determined by dm pin voltage changing by a predetermined amount (e.g., the second threshold level 48b minus the first threshold level 48a, or 90 mV in the illustrative embodiment) within a predetermined rime interval (e.g., one clock cycle).

If the pin voltage has exceeded the second threshold level within the predetermined time interval, then a fault is indicated in block 116, such as with a transition of the open pin signal voutOpen 98. Once the open pin signal voutOpen transitions, AND gate 50 causes the switch 22 to turn off by bringing its gate terminal low in the illustrated example.

After the fault has been indicated in block 116 the system continues to recheck the state of the pin by first disabling the open pin detection in step 110 such, that current sink 18 is enabled to pull down on the pin 10a by opening switch 74 with enVoutCheck 96. If the pin 10a is still open, the voltage will drop, and upon repeating decision block 102, the voltage will have returned below the first threshold. The open pin detection scheme is then reinitiated in block 104 as the process repeats, with the fault condition remaining true (voutOpen) through all of the steps. The process continues to repeat in this manner until the pin 10a is reconnected and it is determined in decision block 108 that the pin voltage has not exceeded the second threshold within the predetermined time interval. Then the fault indication is cleared in block 112 (e.g., by causing a transition in the open pin signal voutOpen 98 and allowing the switch 22 to conduct), pin detection is disabled at block 110, and the process is repeated starting at block 102. When the pin 10a voltage has been driven above and remained above either the first or second threshold the process will only loop decision block 102 with the fault cleared, indicating that the pin 10a is no longer open and the regulator output voltage 26 is again coupled to the VOUT pin 10a.

Figure 3:
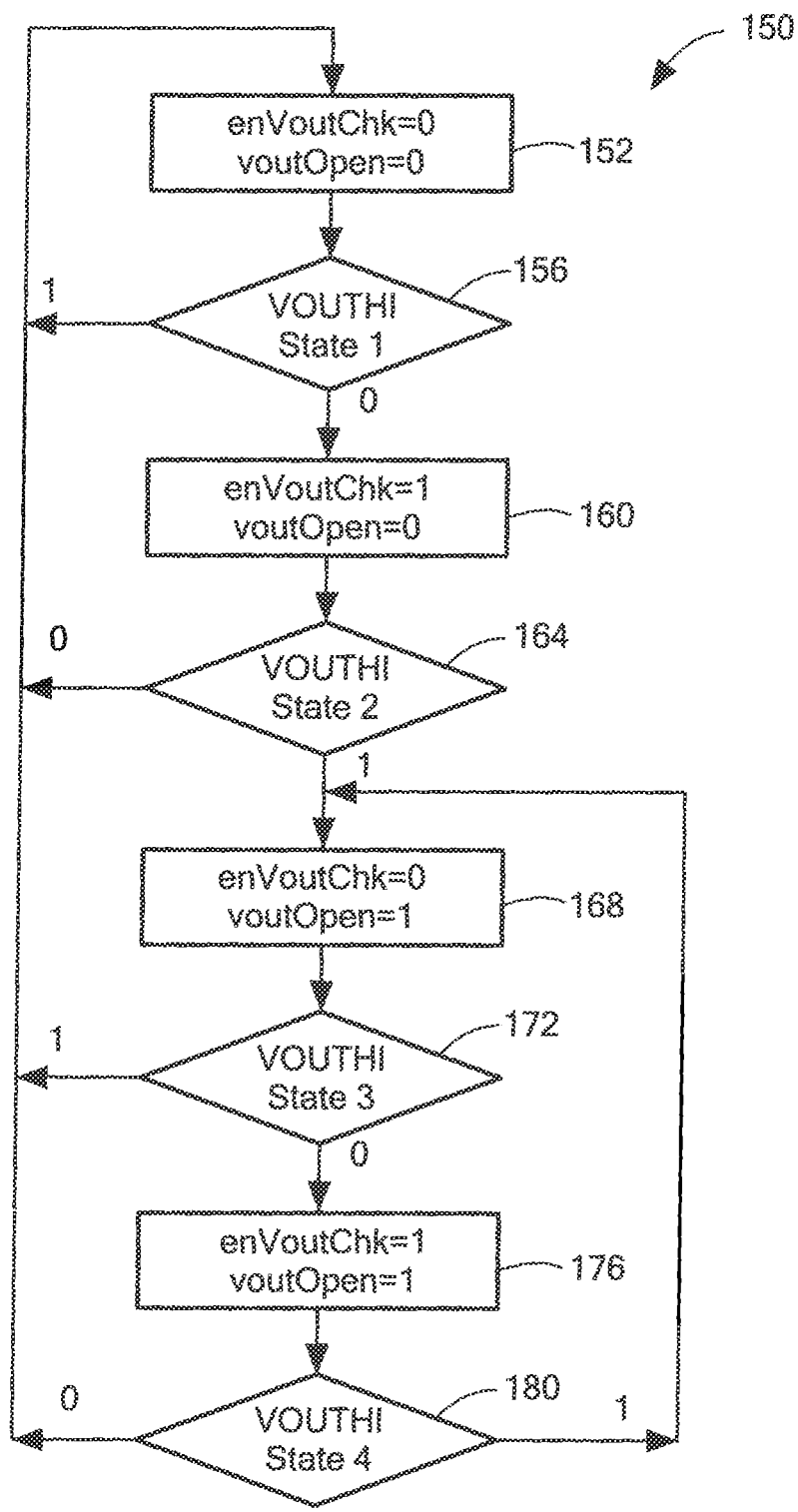
FIG. 3 is a state diagram illustrating operation of the controller state machine of FIG. 1.

Referring also to the state diagram of FIG. 3, an illustrative method 150 implemented by the digital controller state machine 20 (FIG. 1) is shown. Each state of FIG. 3 is gated by a clock signal, such as clock signal 66, so that each decision block has a predetermined number of clock cycles, such as one clock cycle, to complete.

In block 152, the enable signal enVoutChk 96 and the open pin signal voutOpen 98 are initialized to 0. In state 1, represented by decision bock 156, the pin voltage is monitored to determine if the pin voltage falls to below the first threshold level. If the pin voltage falls to below the first threshold level, then VOUTHI 76 goes low and the enable signal enVoutChk 96 is set to 1 to initiate open pin detection and the open pin signal voutOpen 98 remains at 0 in block 160. Whereas if the pin voltage does not fall to below the first threshold level, then VOUTHI 76 stays high and the loop including blocks 152 and 156 is repeated (i.e., the state machine remains in state 1).

In response to the enable signal enVoutChk going high in block 160, open pin detection is commenced by enabling the current source 14, coupling the pull down resistor 38 to the pin 10*a* by closing switch 40, and toggling the multiplexer 48 to change the threshold voltage coupled to the comparator 16 from the first threshold level 48*a* (i.e., of 250 mv) to the second threshold level 48*b* (i.e., of 340 mv). Once the pin detection is commenced in this manner, in the state 2 decision block 164, the VOUTHI signal 76 is monitored.

If the VOUTHI signal 76 goes high while in state 2, then an open pin condition has been detected and a state 3 is entered. The VOUTHI signal will go high if the pin 10*a* is open because the current injected by the current source 14 will be sufficient to cause the pin voltage to rise to exceed the second threshold level during the predetermined time in which decision block 164 is performed (e.g., during a single clock cycle). Alternatively, if the VOUTHI signal remains low in state 2 due to the significant capacitance introduced by Cout (44), then the loop including blocks 152, 156, 160, and 164 is repeated (i.e., the state machine returns to state 1).

Detection of an open pin condition in block 164 causes the open pin check to be terminated and an open pin condition to be indicated. More particularly, in block 168, the pin check is terminated by setting the enVoutChk signal 96 to zero to turn off the current source 14, decouple the pull down resistor 38 from the pin 10*a*, and toggle the multiplexer 48 to change the threshold voltage coupled, to the comparator 16 from the second threshold level 48*b* (i.e., 340 mv) to the first threshold level 48*a* (i.e., 240 mv).

Additionally, in block 168, the voutOpen signal 98 is set to 1 to indicate an open pin condition and certain actions may be taken as a result. For example, the open pin signal voutOpen 98 going high causes the AND gate 50 to prevent the switch 22 from switching. Additionally, the open pin signal voutOpen 98 going high may cause the COMP pin to be pulled down and optionally disable other integrated circuit functions.

In the state 3 decision block 172, the VOUTHI signal 76 is monitored. If the VOUTHI signal stays high during state 3 (i.e., the pin voltage stays above 250 mV) then the loop including blocks 152-172 is repeated as shown (i.e., the state machine returns to state 1).

If the VOUTHI signal 76 goes low during the state 3 decision block 172, this indicates mat the pin voltage has fallen below the first threshold level (i.e., of 250 mV), which is indicative of low capacitance on the VOUT pin as may be indicative of the VOUT pin 10*a* being reconnected to the regulator output 26 and pin detection is recommenced in block 176. More particularly, in block 176, the enable signal enVoutChk 96 goes high to recommence the pin open detection and the voutOpen signal 98 remains high to continue indicating an open pin condition. Open pin detection is commenced by enabling the current source 14, coupling the pull down resistor 38 to the pin 10*a* by closing the switch 40, and toggling the multiplexer 48 to change the threshold voltage coupled to the comparator 16 from the first threshold level 48*a* (i.e., of 250 mv) to the second threshold level 48*b* (i.e., of 340 mv).

In state 4 decision block 180, the VOUTHI signal 76 is monitored. If the VOUTHI signal goes high during state 4, this indicates that the pin voltage has exceeded the second threshold level which is indicative of low capacitance on the VOUT pin, and may be the result of an open pin condition. Accordingly, the state machine returns to state 3 and the loop including blocks 168-180 is repeated under this condition, in which a fault is indicated by setting the voutOpen signal 98 to 1 and the enable signal enVoutChk 96 to 0 to terminate the open pin check. If, alternatively, the VOUTHI signal 76 is low during the state 4 decision block 180, this indicates that the pin voltage has remained below the second threshold level which is indicative of high capacitance on the VOUT pin, and may be the result of the open pin condition being resolved. In this scenario, the state machine returns to state 1 as shown.

Thus, once an open pin condition is detected in state 2 and the regulator is disabled in block 168, a recheck of the pin voltage is forced if the VOUTHI signal goes low in state 3 (i.e., if the pin voltage fells below the first threshold level). This arrangement of re-checking the pin 10*a* allows the integrated circuit to automatically recover from an open pin condition.

It will be appreciated by those of ordinary skill in the art however that while the described methods provide for automatic recovery when an open pin fault condition is resolved, it is possible to treat the open pin condition as a latched fault that must be cleared by a user, such as by reducing the input voltage or other methods. As one example, this latched fault feature could be added by using a memory element in the path of the voutOpen signal 98, such as a flip-flop or an SR latch.

Figure 4:
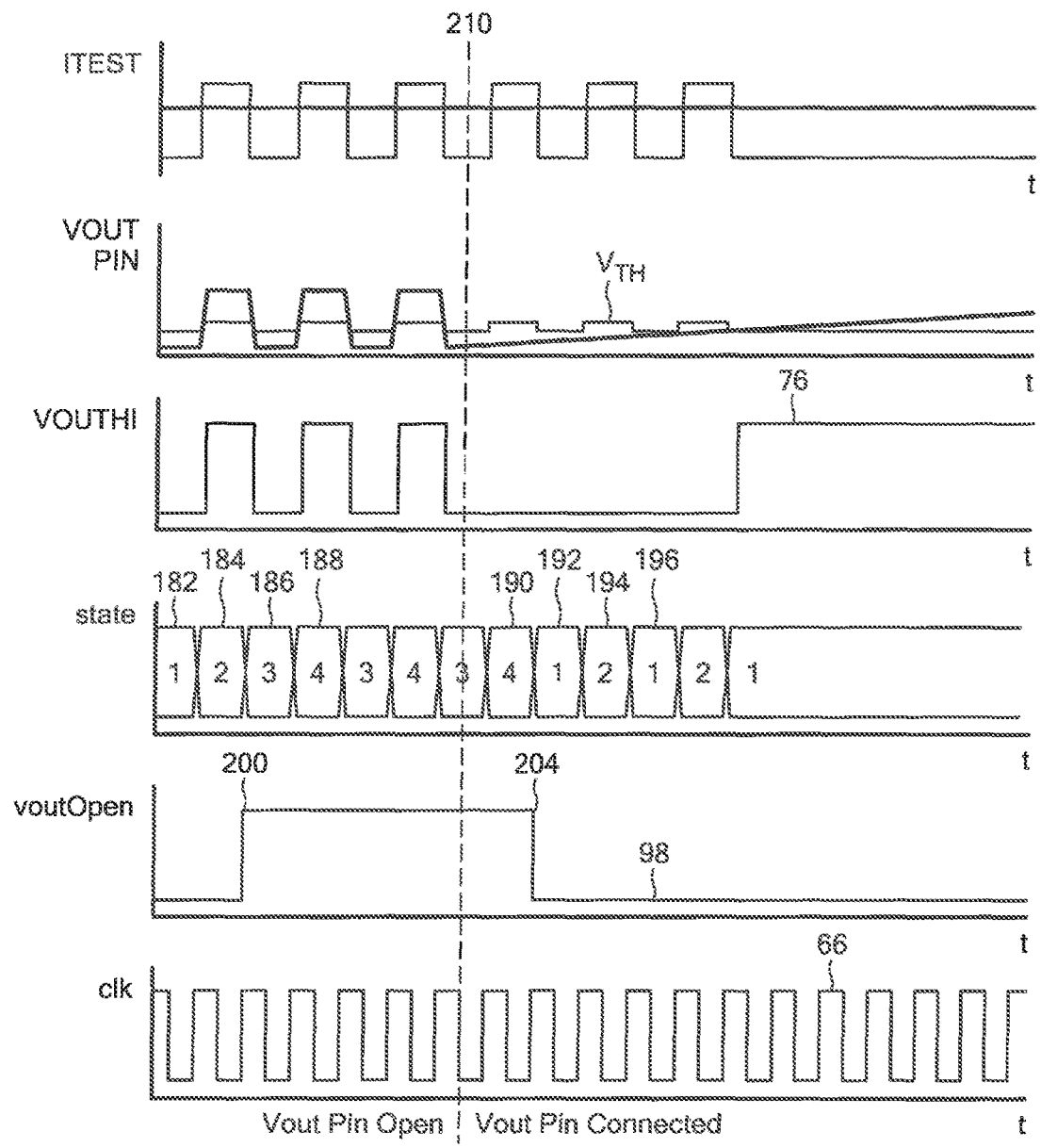
FIG. 4 shows several illustrative waveforms associated with the regulator of FIG. 1.

Referring also to FIG. 4, illustrative waveforms associated with the open pin detector 12 of the regulator control IC 10 of FIG. 1 are shown, including the current from the current source 14 (labeled ITEST), the voltage at the VOUT pin 10*a*, the comparator output signal VOUTHI 76, the state machine states 1-4, the open pin signal voutOpen 98, and the clock signal clk 66. Also shown relative to the VOUT pin voltage is the threshold voltage $V_{TH}$ coupled to the comparator input 16*b*.

The state machine 20 commences in state 1 (labeled 182) during which the enVoutChk signal 96 is low (i.e., ITEST is not sourcing a current to the pin 10*a*) and the VoutOpen signal 98 is low. During this state, the VOUTHI signal 76 is monitored (e.g., in decision block 156 of FIG. 3) and is low since the VOUT pin voltage is below the threshold voltage $V_{TH}$, thereby causing state 2 to be entered (labeled 184).

In state 2 (184), the open pin detection is commenced (as indicated by the ITEST current being sourced to the pin 10*a*). Since the VOUTHI signal 76 went high during state 2 (184), state 3 is entered (186) and a fault is indicated as illustrated by the voutOpen signal 98 going high (200). Since the VOUTHI signal is low in state 3 (186), the fault continues to be indicated and the pin detection is recommenced in state 4 (188).

The state machine continues to toggle between states 3 and 4 in this manner (e.g., blocks 168-180 in FIG. 3) for several clock cycles resulting in a significant change in voltage on the VOUT pin as shown due to the low capacitance due to the open pin condition. At a time 210, the open pin condition is resolved and the pin 10*a* is reconnected to the regulator output 26. As a result, in a subsequent state 4 (190), the VOUT pin voltage is below the threshold voltage $V_{TH}$ causing the state machine to return to state 1 (192) and the voutOpen signal 98 to be initialized to zero (204), as shown. Since the pin voltage is below the threshold voltage in state 1 (192), the open pin detection is commenced and a state 2 (194) is entered. During state 2 (194), the pin voltage is below the threshold voltage $V_{TH}$ causing the VOUTHI signal 76 to remain low and the state machine to return to state 1 (196), as shown. Once the pin voltage is within regulation, the pin voltage remains above the threshold voltage $V_{TH}$ and the state machine remains in state 1, as shown.

It will be appreciated that the first and second threshold voltages 48a, 48b, the source current 14, and the sink current 18 should be carefully selected based on the range of output capacitance 44 and the operating frequency established by oscillator 60. The first threshold level 48a must be selected such that offsets of the comparator 16 and ground drops in the circuit 10 do not alter operation and that the sink current 18 can pull the pin 10a low. The difference between the first and second threshold levels should be selected based on the source current 14 minus the sink current 18, such dial the following equation is satisfied, where $F_{SW}$ is the maximum switching frequency and Cout is the minimum output capacitance.

$$ITEST < Cout*(V_{TH48a} - V_{TH48b})*F_{SW}$$

Note that in most applications at higher switching frequencies, the output capacitance is generally smaller, and at lower switching frequencies, the output capacitance is generally larger, resulting in these two terms to roughly become a constant. Furthermore, the source current 14 should be large enough to slew the pin 10a between, the two threshold levels 48a, 48b in one clock cycle period, even with parasitics present. The sink current 18 should have a magnitude greater than the source current 14 in order to ensure that the VOUT pin 10a is discharged to 0V (the minimum) or beyond the voltage that the pin voltage started at when the source current 14 was last enabled in order to prevent the pin voltage from ratcheting up. The sink current 18 should also be larger than any leakage currents in the system so that the pin voltage does not rise up during the pin open check, which could falsely indicate that there is no open, pro condition. Also, the pull down resistor 38 may be sized such that the source current 14 (the magnitude of current source 18 minus current sink 14) does not cause the pin voltage to exceed the VOUT bias enable threshold set by comparator 84 (e.g., 3.1V in FIG. 1).

All references cited herein are hereby incorporated herein by reference in their entirety.

Having described preferred embodiments of the invention, it will now become apparent to one of ordinary skill in the art that other embodiments incorporating their concepts may be used.

For example, it will be appreciated by those of ordinary skill in the art that the circuits and techniques described herein for detecting an open pin condition on a VOUT pin 10a of a switching regulator are applicable to detecting an open pin condition on any pin of any integrated circuit.

It is felt therefore that these embodiments should not be limited to disclosed embodiments, but rather should be limited only by the spirit and scope of the appended claims.

What is claimed is:

1. An integrated circuit, comprising:
   a current source coupled to a pin of the integrated circuit;
   a comparator having a first input coupled to the pin, a second input selectively coupled to a first threshold voltage or to a second threshold voltage, and an output at which a comparator output signal is provided; and
   a controller responsive to the comparator output signal, the controller having an output coupled to the current source to provide an enable signal to the current source and the controller configured to provide an open pin signal indicative of an open condition at the pin, wherein when the enable signal is at a first level, the first threshold voltage is coupled to the first comparator input and the current source is enabled, and when the enable signal is at a second level, the second threshold voltage is coupled to the first comparator input and the current source is disabled.

2. The integrated circuit of claim 1 further comprising a clamp coupled to the pin to prevent a voltage at the pin from exceeding a predetermined level.

3. The integrated circuit of claim 1 further comprising a current sink coupled to the pin.

4. The integrated circuit of claim 1 wherein the integrated circuit is a regulator control circuit comprising a switch and wherein the switch is turned off in response to the open pin signal.

5. The integrated circuit of claim 4 wherein a regulated output voltage of the regulator is coupled to the pin.

6. The integrated circuit of claim 1 wherein the controller comprises a state machine.

7. The integrated circuit of claim 2 wherein the clamp comprises a resistor coupled between the pin and a reference voltage.

8. A method for detecting an open pin condition of a pin of an integrated circuit, comprising:
   comparing, by a comparator, a voltage at the pin to a first threshold voltage;
   in response to the voltage at the pin falling below the first threshold voltage, initiating an open pin detection by sourcing a current to the pin and comparing, by the comparator, the voltage at the pin to a second threshold voltage; and
   indicating an open pin condition if the voltage at the pin rises to exceed the second threshold voltage within a predetermined time interval.

9. The method of claim 8 further comprising preventing the voltage at the pin from exceeding a predetermined level.

10. The method of claim 8 further comprising re-initiating the open pin detection after an open pin condition is indicated.

11. The method of claim 9 wherein the integrated circuit is a regulator control circuit and the predetermined level is selected according to a VOUT bias enable threshold.

12. The method of claim 8 wherein initiating the open pin detection further comprises changing the threshold voltage at a comparator input from the first threshold voltage to the second threshold voltage.

13. The method of claim 8 wherein the predetermined time interval is a predetermined number of clock cycles.

14. The method of claim 13 wherein the integrated circuit is a switching regulator control circuit and the clock cycles are switching clock cycles.

15. The method of claim 14 wherein a regulated output voltage of the switching regulator is coupled to the pin.

16. The method of claim 8 further comprising sinking a current from the pin.

17. A method for detecting an open pin condition of a pin of an integrated circuit, comprising:
   providing a current to the pin, in response to a voltage at the pin falling below a first threshold voltage;
   determining, by a comparator, if the voltage at the pin rises to exceed a second threshold within a predetermined time interval; and
   preventing the pin voltage from exceeding a predetermined voltage level.

18. The method of claim 17 wherein determining if the voltage at the pin changes by a predetermined amount comprises comparing, by the comparator, the voltage at the pin to the first threshold level at a beginning of the predetermined time interval and to the second threshold level at an end of the predetermined time interval.

19. The method of claim 17 wherein the integrated circuit is a switching regulator control circuit and wherein the predetermined voltage level is selected according to a VOUT bias enable threshold.

* * * * *

UNITED STATES PATENT AND TRADEMARK OFFICE
CERTIFICATE OF CORRECTION

PATENT NO. : 9,641,070 B2
APPLICATION NO. : 14/301487
DATED : May 2, 2017
INVENTOR(S) : Joshua Wibben It is certified that error appears in the above-identified patent and that said Letters Patent is hereby corrected as shown below:

In the Specification

Column 1, Line 59, delete "fee pin," and replace with --the pin,--

Column 2, Line 17, delete "fusilier" and replace with --further--

Column 3, Line 7, delete "condition, at" and replace with --condition at--

Column 3, Line 12, delete "(I.e.," and replace with --(i.e.,--

Column 3, Line 23, delete "former" and replace with --further--

Column 4, Line 3, delete "Input" and replace with --input--

Column 4, Line 60, delete "COM" and replace with --COMP--

Column 5, Line 4, delete "in COMP" and replace with --in the COMP--

Column 5, Line 30, delete "voltage provided" and replace with --voltage is provided--

Column 5, Line 45, delete ", here of 250 mv" replace with --, here 250 mv--

Column 6, Line 24, delete "dm" and replace with --the--

Column 6, Line 27, delete "rime" and replace with --time--

Column 6, Line 37, delete "such, that" and replace with --such that--

Column 7, Line 36, delete "coupled, to" and replace with --coupled to--

Signed and Sealed this
Eighth Day of May, 2018

Andrei Iancu
*Director of the United States Patent and Trademark Office*

CERTIFICATE OF CORRECTION (continued)
U.S. Pat. No. 9,641,070 B2

Column 7, Line 53, delete "mat" and replace with --that--

Column 8, Line 20, delete "fells" and replace with --falls--

Column 9, Line 18, delete "dial" and replace with --that--

Column 9, Line 29, delete "between, the" and replace with --between the--

Column 9, Line 38, delete "open, pro" and replace with --open pin--